(12) United States Patent
Lim

(10) Patent No.: US 10,431,623 B2
(45) Date of Patent: Oct. 1, 2019

(54) METHOD APPLIED TO BJT PIXEL OF IMAGE SENSOR APPARATUS AND IMAGE SENSOR APPARATUS

(71) Applicant: PixArt Imaging Inc., Hsin-Chu (TW)

(72) Inventor: Wooi Kip Lim, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 160 days.

(21) Appl. No.: 15/790,041

(22) Filed: Oct. 22, 2017

(65) Prior Publication Data
US 2019/0123091 A1   Apr. 25, 2019

(51) Int. Cl.
*H01L 27/146* (2006.01)
*H04N 5/235* (2006.01)
*H04N 5/369* (2011.01)

(52) U.S. Cl.
CPC ..... *H01L 27/14681* (2013.01); *H04N 5/2354* (2013.01); *H04N 5/3696* (2013.01)

(58) Field of Classification Search
CPC .............. H04N 5/2354; H04N 5/3696; H01L 27/14681
See application file for complete search history.

(56) References Cited

U.S. PATENT DOCUMENTS

| | | | |
|---|---|---|---|
| 6,529,241 B1* | 3/2003 | Clark | H01L 27/14609 250/208.1 |
| 7,593,048 B2* | 9/2009 | Clark | H01L 27/14609 348/297 |
| 9,412,784 B1* | 8/2016 | Lim | H01L 27/14681 |
| 2015/0042566 A1* | 2/2015 | Lim | H01L 27/14681 345/166 |
| 2016/0212362 A1* | 7/2016 | Pang | H04N 5/3559 |
| 2017/0070688 A1* | 3/2017 | Pang | H04N 5/378 |
| 2017/0142352 A1* | 5/2017 | Pang | H04N 5/378 |

* cited by examiner

*Primary Examiner* — Chia Wei A Chen
*Assistant Examiner* — John H Morehead, III
(74) *Attorney, Agent, or Firm* — Winston Hsu

(57) ABSTRACT

A method applied to a BJT pixel of an image sensor apparatus includes: obtaining at least one of a surface quality signal of a first image sensed by the BJT pixel and a shutter turn-on time corresponding to the first image; and adaptively adjusting a pre-flash time of the BJT pixel for sensing of a second image according to the at least one of the surface quality signal of the first image and the shutter turn-on time corresponding to the first image; wherein the second image follows the first image.

20 Claims, 4 Drawing Sheets

METHOD APPLIED TO BJT PIXEL OF IMAGE SENSOR APPARATUS AND IMAGE SENSOR APPARATUS

BACKGROUND OF THE INVENTION

1. Field of the Invention

The invention relates to an image sensing mechanism, and more particularly a method applied to a BJT pixel of a pixel array of an image sensor apparatus and the image sensor apparatus.

2. Description of the Prior Art

Generally speaking, a conventional scheme may configure a fixed and enough long pre-flash time for bipolar-junction-transistor (BJT) pixels of a pixel array of a conventional image sensor device, to make sure that the conventional image sensor device used as an optical navigation device can operate on various kinds of working surface to generate good results in tracking. For example, the fixed and enough long pre-flash time may be configured as 180 microseconds. The pre-flash time means a time period from the timing of a light emitting unit being turned on to the timing of BJT pixel entering a stable beta condition. The fixed and enough long pre-flash time will dominate the total turn-on time period of the light emitting unit. This means that the total turn-on time period of the light emitting unit is also configured to be enough long. Inevitably, the power consumption of conventional image sensor device will be higher.

SUMMARY OF THE INVENTION

Therefore one of the objectives of the invention is to provide a method applied to a BJT pixel of a pixel array of an image sensor apparatus and the image sensor apparatus, to solve the problems.

According to embodiments of the invention, a method applied to a BJT pixel of a pixel array of an image sensor apparatus is disclosed. The method comprises: obtaining at least one of a surface quality signal of a first image sensed by the BJT pixel and a shutter turn-on time corresponding to the first image; and adaptively adjusting a pre-flash time of the BJT pixel for sensing of a second image according to the at least one of the surface quality signal of the first image and the shutter turn-on time corresponding to the first image. The second image follows the first image.

According to the embodiments, an image sensor apparatus is disclosed. The apparatus comprises a pixel array and a processor. The pixel array has at least one bipolar-junction-transistor (BJT) pixel which is configured to sense a first image at least. The processor is coupled to the pixel array and configured to: obtain at least one of a surface quality signal of the first image sensed by the BJT pixel and a shutter turn-on time corresponding to the first image; and adaptively adjust a pre-flash time of the BJT pixel for sensing of a second image according to the at least one of the surface quality signal of the first image and the shutter turn-on time corresponding to the first image. The second image follows the first image.

According to the embodiments, the method and apparatus can implement on-the-fly and adaptive adjustment for the pre-flash time of BJT pixels so as to minimize the turn-on time period of a light emitting circuit, and thus can overall improve the battery life if the light emitting circuit is powered by a battery.

These and other objectives of the present invention will no doubt become obvious to those of ordinary skill in the art after reading the following detailed description of the preferred embodiment that is illustrated in the various figures and drawings.

DETAILED DESCRIPTION

The invention is to provide a method for dynamically or adaptively adjust a pre-flash time of a pixel array having bipolar-junction-transistor (BJT) pixels to sense next frame(s)/image(s) according to specific information corresponding to previous frame(s)/image(s) such as surface quality signal(s) of previous frame(s)/image(s) and/or information of shutter turn-on time of the previous frame(s)/image(s), so as to save more power as well as avoid tracking performance degradation. The adjusting operation can be also called "on-the-fly" adjusting operation. Also, the method can minimize a total turn-on time of a light emitting unit as far as possible and thus can extend the battery life.

Figure 1:
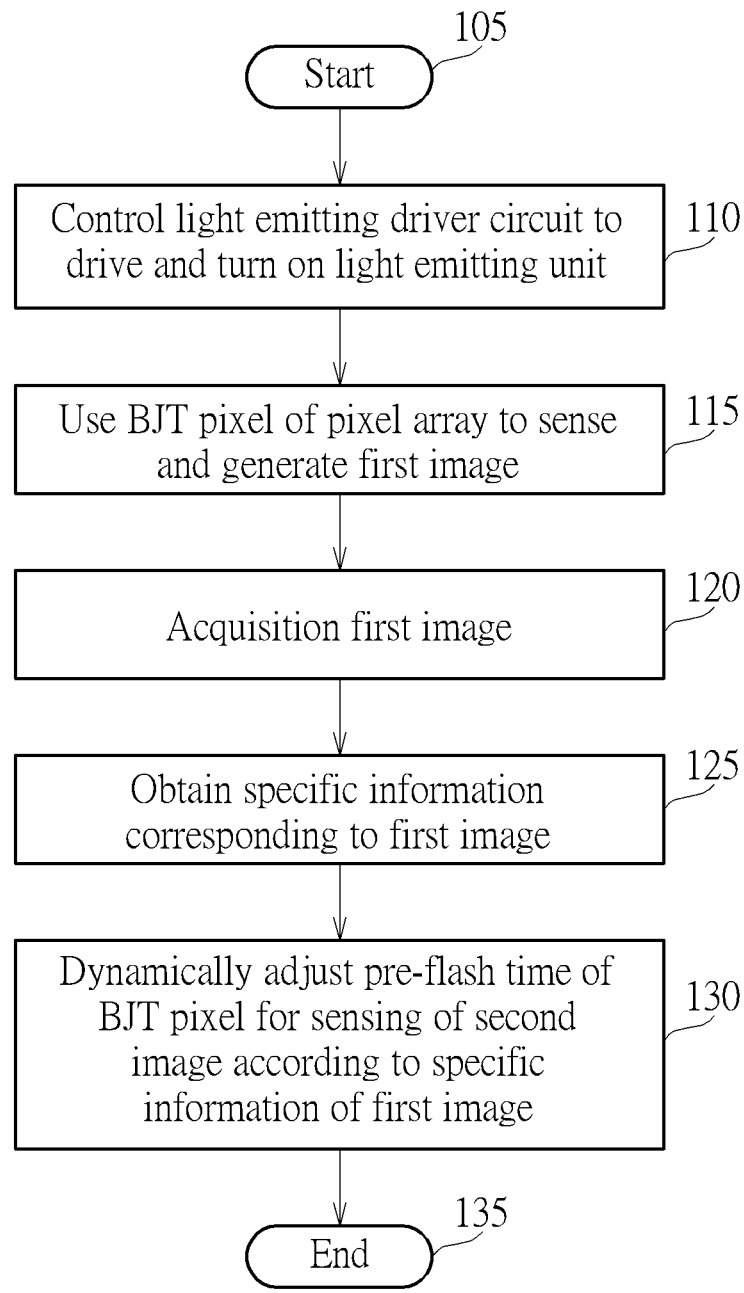
FIG. 1 is a flowchart of a method for adjusting a pre-flash time of an image sensor apparatus having a pixel array including BJT pixels according to embodiments of the invention.

FIG. 1 is a flowchart of a method for adjusting a pre-flash time of an image sensor apparatus having a pixel array including BJT pixels according to embodiments of the invention. Provided that substantially the same result is achieved, the steps of the flowchart shown in FIG. 1 need not be in the exact order shown and need not be contiguous, that is, other steps can be intermediate. Steps are detailed in the following:

Step 105: Start;

Step 110: Control a light emitting driver circuit to drive and turn on a light emitting unit such as a light-emitting diode (LED) to emit light rays;

Step 115: Use at least one BJT pixel of the pixel array to sense and generate at least one first image according to a shutter turn-on time which can be dynamically adjusted by the image sensor apparatus;

Step 120: Acquisition the at least one first image;

Step 125: Obtain specific information corresponding to the at least one first image wherein the specific information for example comprises the shutter turn-on time and/or a surface quality signal of the at least one first image;

Step 130: Dynamically adjust the pre-flash time of the at least one BJT pixel of pixel array for sensing of a second image according to the obtained specific information of the at least first image;

and

Step 135: End.

Figure 2:
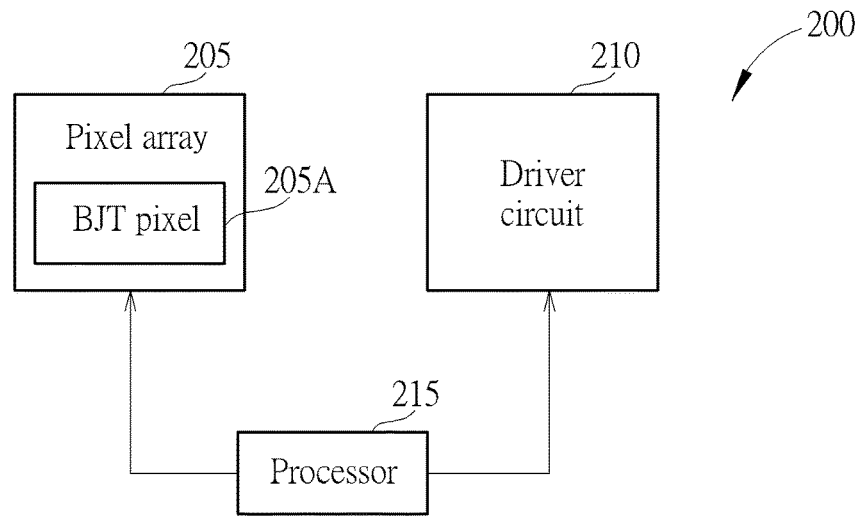
FIG. 2 is a block diagram of an embodiment of an image sensor apparatus according to the flowchart of FIG. 1.

FIG. 2 is a block diagram of an embodiment of an image sensor apparatus 200 according to the flowchart of FIG. 1. The image sensor apparatus 100 comprises a pixel array 205, a light emitting driver circuit 210 such as a light emitting diode (LED) driver or a Laser diode driver, and a processor 215 wherein the pixel array 205 comprises BJT pixels 205A (i.e. BJT pixel circuits). The processor 215 can be arranged to execute specific program codes to control the pixel array 205 and light emitting driver circuit 210. The image sensor apparatus 200 for example (but not limited) is arranged to use the light emitting driver circuit 210 to generate light ray(s) to a working surface, use the BJT pixels 205A to sense light reflected from the working surface, on which the image sensor apparatus 200 is placed/moved, to generate frames/images. The image sensor apparatus 200 for example is installed within an optical navigation device such as an optical mouse device (but not limited) for capturing frames/images reflected from the working surface so as to sense motion of the optical mouse device on the working surface. The processor 215 can dynamically control and adjust the pre-flash time of BJT pixels 205A and dynamically drive the light emitting driver circuit 110 for sensing of a next frame based on the information of previous frame(s)/image(s).

In practice, the processor 110 is coupled to the pixel array 105 and is configured for obtaining or calculating at least one of a surface quality signal(s) of first image(s) sensed by the BJT pixel 205A and shutter turn-on time(s) corresponding to the first image(s), generating a control signal according to the at least one of the surface quality signal(s) of the first image(s) sensed by the BJT pixel 205A and the shutter turn-on time(s) corresponding to the first image(s), and adaptively adjusting a pre-flash time of the BJT pixel 205A for sensing of a second image according to the generated control signal; wherein the second image follows the first image(s). That is, the image sensor apparatus 100 is arranged to employ a surface quality signal of previous sensed image(s) and/or its corresponding shutter turn-on time(s) to adjust a pre-flash time of the BJT pixel 205A to sense a next image. By doing so, the image sensor apparatus 100 can shorten the pre-flash time to save more power when the surface quality signal is better.

Figure 3:
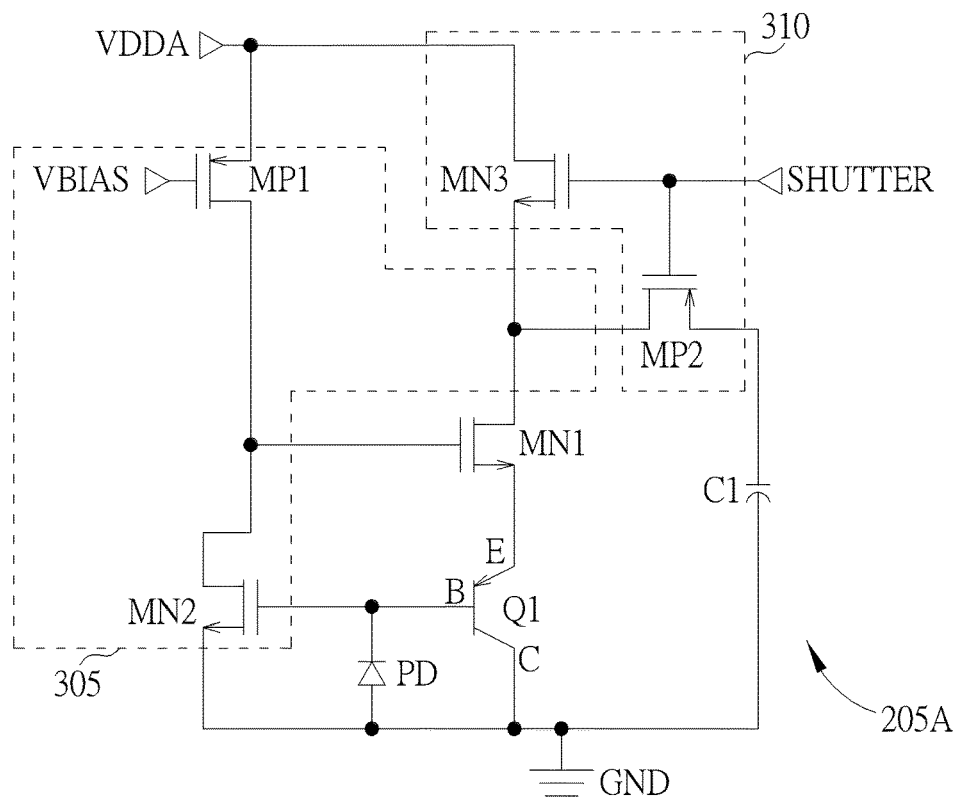
FIG. 3 is a circuit diagram illustrating an example of the BJT pixel of FIG. 2.

For each BJT pixel 205A, a BJT pixel 205A is configured for sensing an image, i.e. a pixel image of a frame, which is different from the frame, during the shutter turn-on time. Refer to FIG. 3. FIG. 3 is a circuit diagram illustrating an example of the BJT pixel 205A of FIG. 2. As shown in FIG. 3, the BJT pixel 205A comprises a BJT Q1, a photo detector such as a photo diode PD, a feedback amplifier circuit 305, a shutter circuit 310, and a storage capacitor C1. The feedback amplifier circuit 305 comprises transistors MN1, MN2, and MP1. The shutter circuit 310 comprises transistors MN3 and MP2. The photo diode PD is coupled between the base of BJT Q1 and the ground level GND. The feedback amplifier circuit 305 is coupled to the base of the BJT Q1 and its emitter, a power level VDDA to receive an operation voltage, and is coupled to a bias level VBIAS to receive a bias voltage. The shutter circuit 310 is coupled to power level VDDA, feedback amplifier circuit 305, and the storage capacitor C1, and is controlled by a shutter signal SHUTTER generated by the processor 215.

For the BJT pixel 205A, at the beginning of sensing an image, the processor 215 is arranged to control the light emitting driver circuit 110 to drive a light emitting diode to emit/illuminate light rays to the working surface, and arranged to turn on the BJT pixel 205A to sense light rays reflected from the working surface. When the light shines on the base to collector photo-junction of BJT pixel 205A, i.e. the junction of photo diode PD, the photo diode PD generates a base current IB based on a light intensity of a light incident on the photo diode PD. The level of base current IB is dependent upon incident light intensity and will become higher if the incident light intensity becomes higher. Then, the feedback amplifier circuit 305 starts to generate and increase a voltage drop VBE across the emitter and base of BJT Q1 when the incident light shines on the base until the BJT Q1 operates with a stable beta condition. The needed time period from turning on the LED (or Laser diode) to causing the BJT Q1 operate with the stable beta condition is called the pre-flash time.

Figure 4:
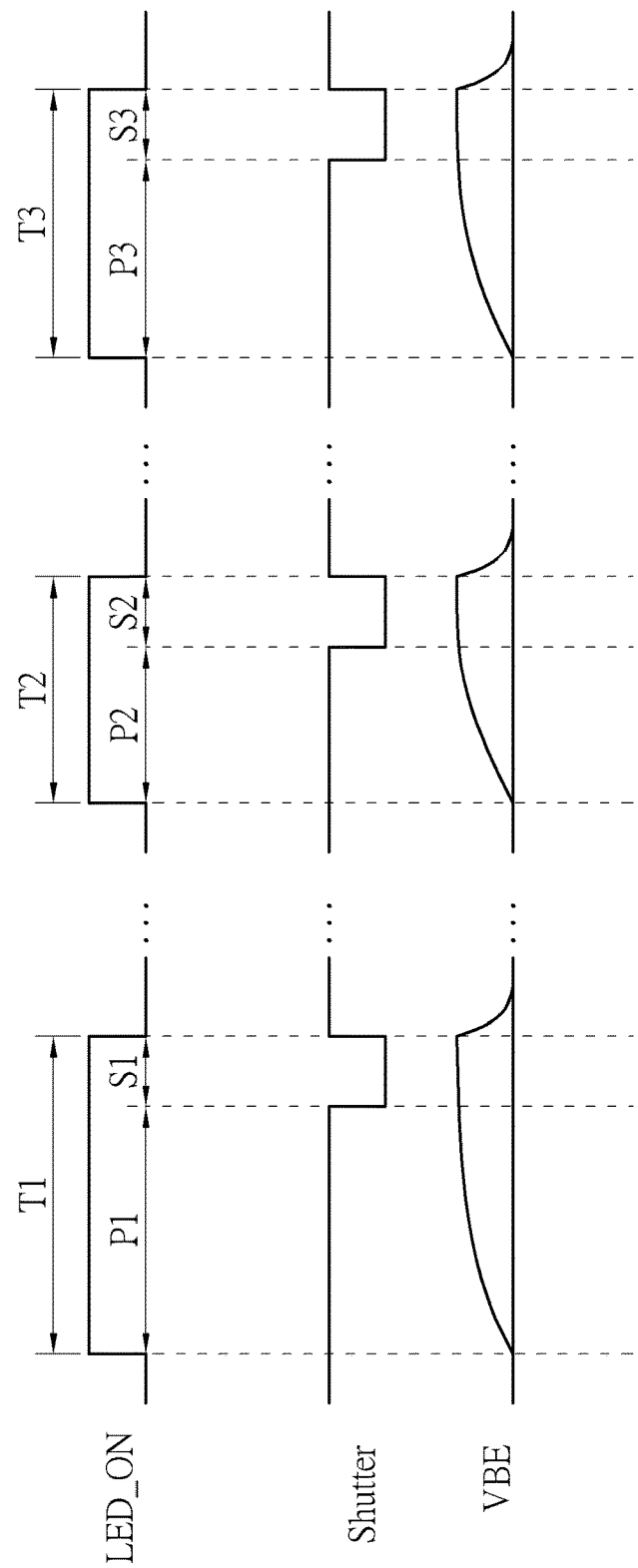
FIG. 4 is a diagram illustrating different examples of a pre-flash time adaptively adjusted and a shutter turn-on time for the BJT pixel of FIG. 2.

In the embodiments, the processor 215 is arranged to adaptively or dynamically adjust the pre-flash time for each of the BJT pixels 205A of pixel array 105. Specifically, the processor 215 adjusts the pre-flash time for the BJT pixel 205A to sense and generate image(s) based on information of image(s) previously sensed. FIG. 4 is a diagram illustrating different examples of a pre-flash time adaptively adjusted and a shutter turn-on time for the BJT pixel 205A of FIG. 2. As shown in FIG. 4, this shows three different examples of pre-flash time wherein LED ON indicates the whole turn-on period of LED, Shutter indicates the shutter turn-on time, and VBE indicates the level of voltage drop across the emitter and base of BJT Q1. P1-P3 indicate different lengths of pre-flash time, T1-T3 indicate different total turn-on time periods of light emitting circuit such as LED or Laser diode, and S1-S3 indicate different lengths of shutter turn-on time. For instance, the pre-flash time may be initially configured as P1 which is longer than P2 and P3 to make sure that the image sensor apparatus 200 can correctly operate for different types of working surface. Then, if the image sensor apparatus 200 is being moved on a brighter working surface, the processor 215 can dynamically shorten the pre-flash time and may configure the pre-flash time as P2 which is shorter than P1 and P3. Then, if the image sensor apparatus 200 is moved from the brighter working surface to a dimmer working surface, the processor 215 can dynamically extend the pre-flash time P2 and may configure the pre-flash time as P3 which is shorter than P1 and longer than P2. That is, by dynamically or adaptively adjusting the pre-flash time in response to different types of working surface, the processor 215 can dynamically or adaptively adjusting the whole LED turn-on time period so as to make the period T2 be shorter than T1 and T3 and make the period T3 be shorter than T1 and longer than T2. The above examples are merely used for illustrative purposes and are not meant to be limitations.

In practice, in the embodiment, the processor 215 may not need to detect the type of a current working surface; the processor 215 can calculate a surface quality signal of an image and/or obtain the corresponding shutter turn-on time to determine how to adjust the pre-flash time.

Taking the example of surface quality signal, for sensing a current image (e.g. a second image), the processor 215 calculate and refers to a surface quality signal of at least one previous image (e.g. at least one first image) sensed by the BJT pixel 205A to generate a control signal and uses such control signal to dynamically control and adjust the pre-flash time of BJT pixel 205A for sensing of such second image. For example, the processor 215 may calculate a surface quality signal of a first image or calculate an average surface quality signal of multiple first images to generate the control signal. The advantage of using the average surface quality signal is to improve the stability of system performance.

In another embodiment, the processor 215 may refer to the shutter turn-on time(s) corresponding to the first image(s) sensed by the BJT pixel 205A to generate the control signal and use such control signal to dynamically control and adjust the pre-flash time of BJT pixel 205A for sensing of the second image. For example, the processor 215 may obtain a single shutter turn-on time corresponding to a first image or calculate an average shutter turn-on time of multiple first images to generate the control signal. The advantage of using the average shutter turn-on time is to improve the stability of system performance. Further, in other embodiment, the processor 215 may refer to both the shutter turn-on time(s) and the surface quality signal(s) mentioned above to generate the control signal and use such control signal to dynamically control and adjust the pre-flash time of BJT pixel 205A for sensing of the second image. For example, the processor 215 may shorten the pre-flash time of the BJT pixel 205A for sensing of the second image when detecting that the control signal indicates the strength value of the surface quality signal is greater than a threshold and the shutter turn-on time becoming shorter.

The surface quality signal of the first image indicates a strength value of image feature(s) of the first image on the working surface. A higher surface quality signal means that the strength value of feature of the first image is higher. A higher strength value of feature of the first image means that a high-contrast image which can be more easily tracked by an optical navigation device such as an optical mouse device.

Figure 5:
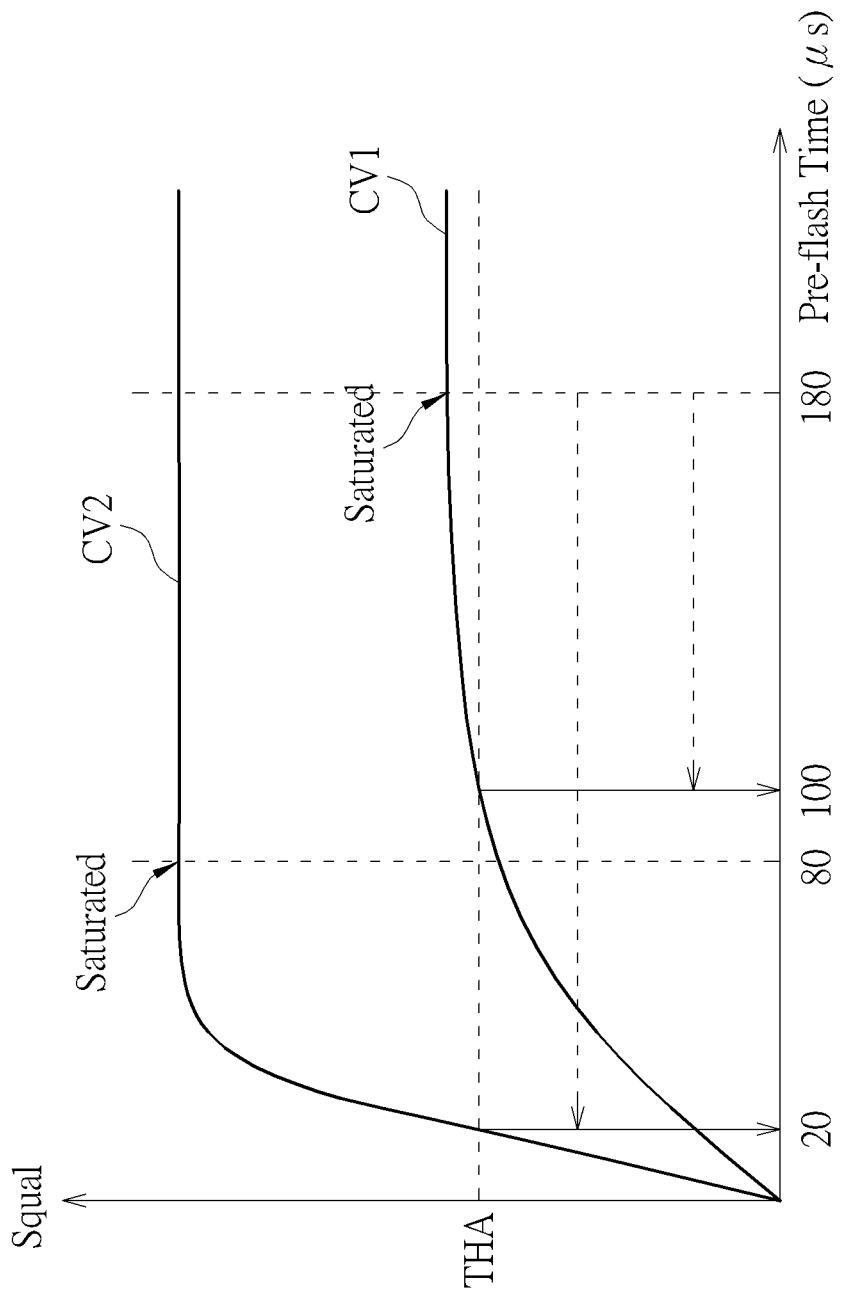
FIG. 5 is a diagram showing examples of the relation between the strength value of surface quality signal Squal and the length of pre-flash time.

FIG. 5 is a diagram showing examples of the relation between the strength value of surface quality signal Squal and the length of pre-flash time. The vertical axis represents the strength value of surface quality signal Squal, and the horizontal axis represents the length of pre-flash time which can be adjusted by the processor 215. As shown in FIG. 5, the curve CV1 indicates an example of a dimmer working surface having less contrast features, and the curve CV2 indicates an example of a brighter working surface having more contrast features. The strength value of surface quality signal Squal is increased with the pre-flash time, and will become saturated after a particular length of the pre-flash time. For example, as indicated by curve CV1, the strength value of surface quality signal Squal is gradually increased and becomes higher than a specific threshold THA at 100 microseconds, and becomes saturated at 180 microseconds. As indicated by curve CV2, the strength value of surface quality signal Squal is rapidly increased and becomes higher than the specific threshold THA at 20 microseconds, and becomes saturated at 80 microseconds.

The processor 215 can be arranged to compare the strength value of surface quality signal Squal with specific threshold THA to determine whether the strength value of surface quality signal Squal become higher than the specific threshold THA. If the strength value is or becomes higher than the specific threshold THA, the processor 215 is arranged to determine to adjust the length of pre-flash time adaptively. It is not required for the image sensor apparatus 100 to detect or know which working surface the apparatus 100 is currently moved on to determine the pre-flash time. The image sensor apparatus 100 is capable of comparing the strength value of surface quality signal Squal, currently measured/calculated, with the specific threshold THA to dynamically or adaptively adjust the length of pre-flash time.

For example, the length of pre-flash time may be configured as 180 microseconds initially. If in this situation the image sensor apparatus 100 as an optical navigation device is moved and stayed on the dimmer working surface of curve CV2, the processor 215 may be arranged to compare the strength value of surface quality signal Squal, currently measured/calculated, with the specific threshold THA to determine whether to shorten or extend the pre-flash time. For instance, if the strength value is greater than the specific threshold A, the processor 215 is arranged to shorten the pre-flash time gradually or by multiple stages. For instance, the processor 215 can adjust the pre-flash time from a first predetermined stage to a second predetermined stage. Once the processor 215 detects that the strength value becomes smaller than the specific threshold A, the processor 215 is arranged to extend the pre-flash time so as to maintain the pre-flash time to be longer than 100 microseconds for the example of dimmer working surface of curve CV2. It should be noted that the performance of optical navigation can be still maintained at a high level since the strength value of surface quality signal Squal is kept greater than specific threshold A.

It should be noted that the processor 215 in another embodiment may be arranged to adjust the pre-flash time of the BJT pixel 205A for sensing of the second image based on a specific equation/formula/function/algorithm which is used to calculate a target value of the pre-flash time. Thus, the processor 215 can directly configure the pre-flash time as the target value without gradually adjusting the pre-flash time.

If in another situation the image sensor apparatus 100 as an optical navigation device is moved on the brighter working surface of curve CV1, by comparing the strength value of surface quality signal Squal, currently measured/calculated, with the specific threshold THA, the processor 215 is arranged to shorten the pre-flash time gradually or by multiple stages. Once the processor 215 detects that the strength value becomes smaller than the specific threshold A, the processor 215 is arranged to extend the pre-flash time so as to maintain the pre-flash time to be longer than 20 microseconds for the example of brighter working surface of curve CV1. It should be noted that the performance of optical navigation can be still maintained at a high level since the strength value of surface quality signal Squal is kept greater than specific threshold A in this example.

In addition, the specific threshold A is adjustable and can be implemented with different values in various examples. In addition, in other embodiments, for the dimmer working surface of curve CV2, the processor 215 may be arranged to dynamically control the pre-flash time among 100 microseconds and 180 microseconds, i.e. from the strength value of surface quality signal Squal of curve CV2 being greater than specific threshold THA to the strength value being saturated. Further, for the brighter working surface of curve CV1, the processor 215 can be arranged to dynamically control the pre-flash time among 20 microseconds and 80 microseconds, i.e. from the strength value of surface quality signal Squal of curve CV1 being greater than specific threshold THA to the strength value being saturated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method applied to a BJT pixel of a pixel array of an image sensor apparatus, comprising:
   obtaining at least one of a surface quality signal of a first image sensed by the BJT pixel and a shutter turn-on time corresponding to the first image; and
   adaptively adjusting a pre-flash time of the BJT pixel for sensing of a second image according to the at least one of the surface quality signal of the first image and the shutter turn-on time corresponding to the first image;
   wherein the second image follows the first image.

2. The method of claim 1, wherein the generating step comprises:
   sensing to acquire the first image by using the BJT pixel;
   calculating the surface quality signal of the first image, the surface quality signal indicating a strength of image feature(s) of the first image; and
   generating the control signal based on the calculated surface quality signal.

3. The method of claim 1, wherein the generating step comprises:
   acquiring the shutter turn-on time corresponding to the first image; and
   generating the control signal based on the shutter turn-on time.

4. The method of claim 1, wherein the generating step comprises:
   sensing to acquire the first image by using the BJT pixel;
   calculating the surface quality signal of the first image, the surface quality signal indicating a strength of image feature(s) of the first image;
   acquiring the shutter turn-on time corresponding to the first image; and
   generating the control signal based on the calculated surface quality signal and the acquired shutter turn-on time.

5. The method of claim 1, wherein the adaptively adjusting step comprises:
   shortening the pre-flash time of the BJT pixel for sensing of the second image when detecting that the control signal indicates a value of the surface quality signal being greater than a threshold; and
   extending the pre-flash time of the BJT pixel for sensing of the second image when detecting that the control signal indicates the value of the surface quality signal being smaller than the threshold.

6. The method of claim 1, wherein the adaptively adjusting step comprises:
   shortening the pre-flash time of the BJT pixel for sensing of the second image when detecting that the control signal indicates the shutter turn-on time becoming shorter; and
   extending the pre-flash time of the BJT pixel for sensing of the second image when detecting that the control signal indicates the shutter turn-on time becoming longer.

7. The method of claim 1, wherein the adaptively adjusting step comprises:
   shortening the pre-flash time of the BJT pixel for sensing of the second image when detecting that the control signal indicates both of a value of the surface quality signal being greater than a threshold and the shutter turn-on time becoming shorter.

8. The method of claim 1, wherein the adaptively adjusting step comprises:
   adjusting the pre-flash time of the BJT pixel for sensing of the second image from a first predetermined stage to a second predetermined stage.

9. The method of claim 1, wherein the adaptively adjusting step comprises:
   adjusting the pre-flash time of the BJT pixel for sensing of the second image based on a specific equation which is used to calculate a target value of the pre-flash time according to the control signal.

10. The method of claim 1, wherein the first image and the second image sensed by the BJT pixel are generated from by using a light emitting circuit to emit light to a specific surface and sensing an intensity of light reflected from the specific surface.

11. An image sensor apparatus, comprising:
    a pixel array, having at least one bipolar-junction-transistor (BJT) pixel which is configured to sense a first image at least;
    a processor, coupled to the pixel array, configured to:
    obtain at least one of a surface quality signal of the first image sensed by the BJT pixel and a shutter turn-on time corresponding to the first image; and
    adaptively adjust a pre-flash time of the BJT pixel for sensing of a second image according to the at least one of the surface quality signal of the first image and the shutter turn-on time corresponding to the first image;
    wherein the second image follows the first image.

12. The image sensor apparatus of claim 11, wherein the processor is arranged for:
    sensing to acquire the first image by using the BJT pixel;
    calculating the surface quality signal of the first image, the surface quality signal indicating a strength of image feature(s) of the first image; and
    generating the control signal based on the calculated surface quality signal.

13. The image sensor apparatus of claim 11, wherein the processor is arranged for:
    acquiring the shutter turn-on time corresponding to the first image; and
    generating the control signal based on the shutter turn-on time.

14. The image sensor apparatus of claim 11, wherein the processor is arranged for:
    sensing to acquire the first image by using the BJT pixel;
    calculating the surface quality signal of the first image, the surface quality signal indicating a strength of image feature(s) of the first image;
    acquiring the shutter turn-on time corresponding to the first image; and
    generating the control signal based on the calculated surface quality signal and the acquired shutter turn-on time.

15. The image sensor apparatus of claim 11, wherein the processor is arranged for:
    shortening the pre-flash time of the BJT pixel for sensing of the second image when detecting that the control signal indicates a value of the surface quality signal being greater than a threshold; and
    extending the pre-flash time of the BJT pixel for sensing of the second image when detecting that the control signal indicates the value of the surface quality signal being smaller than the threshold.

16. The image sensor apparatus of claim 11, wherein the processor is arranged for:
    shortening the pre-flash time of the BJT pixel for sensing of the second image when detecting that the control signal indicates the shutter turn-on time becoming shorter; and
    extending the pre-flash time of the BJT pixel for sensing of the second image when detecting that the control signal indicates the shutter turn-on time becoming longer.

17. The image sensor apparatus of claim 11, wherein the processor is arranged for:
    shortening the pre-flash time of the BJT pixel for sensing of the second image when detecting that the control signal indicates both of a value of the surface quality signal being greater than a threshold and the shutter turn-on time becoming shorter.

18. The image sensor apparatus of claim 11, wherein the processor is arranged for:
    adjusting the pre-flash time of the BJT pixel for sensing of the second image from a first predetermined stage to a second predetermined stage.

19. The image sensor apparatus of claim 11, wherein the processor is arranged for:
    adjusting the pre-flash time of the BJT pixel for sensing of the second image based on a specific equation which is used to calculate a target value of the pre-flash time according to the control signal.

20. The image sensor apparatus of claim 11, wherein the first image and the second image sensed by the BJT pixel are generated from by using a light emitting circuit to emit light to a specific surface and sensing an intensity of light reflected from the specific surface.

* * * * *